United States Patent [19]
Gorecki

[11] Patent Number: 4,543,498
[45] Date of Patent: Sep. 24, 1985

[54] PROCESS INSENSITIVE CMOS WINDOW DETECTOR

[75] Inventor: James L. Gorecki, Chandler, Ariz.

[73] Assignee: Honeywell Inc., Minneapolis, Minn.

[21] Appl. No.: 418,516

[22] Filed: Sep. 16, 1982

[51] Int. Cl.[4] .............. H03K 17/153; G01R 19/165; G01R 29/027

[52] U.S. Cl. .................................. 307/360; 307/363

[58] Field of Search ............... 307/350, 362, 363, 290

[56] References Cited

U.S. PATENT DOCUMENTS

| | | | |
|---|---|---|---|
| 4,063,119 | 12/1977 | Odell et al. | 307/290 |
| 4,302,690 | 11/1981 | Gollinger et al. | 307/360 |
| 4,438,349 | 3/1984 | Shoji | 307/362 |

Primary Examiner—John Zazworsky
Attorney, Agent, or Firm—Theodore F. Neils; David R. Fairbairn

[57] ABSTRACT

A CMOS window detector provides outputs which indicate whether an input voltage is within a voltage "window". The window detector includes a bias circuit and first and second inverter circuits. A bias current is established by the bias circuit as a function of a reference voltage. The first and second inverter circuits each include a current mirror field effect transistor (FET) and a current control FET connected in a series current path. The current mirror FETs are connected to the bias circuit to provide two different mirror currents. The mirror currents are a function of the bias current and the current mirror FET channel shape factors. The input voltage signal is applied to the gates of the current control FETs of the first and second inverters. The window voltage level of each inverter circuit is independent of the other inverter circuit and is determined as a function of the mirror current and channel shape factor of the current control FET. Logic level outputs taken from first and second inverter circuits indicate whether an input signal voltage is within or outside the window created by the window voltage levels of the two inverter circuits.

17 Claims, 1 Drawing Figure

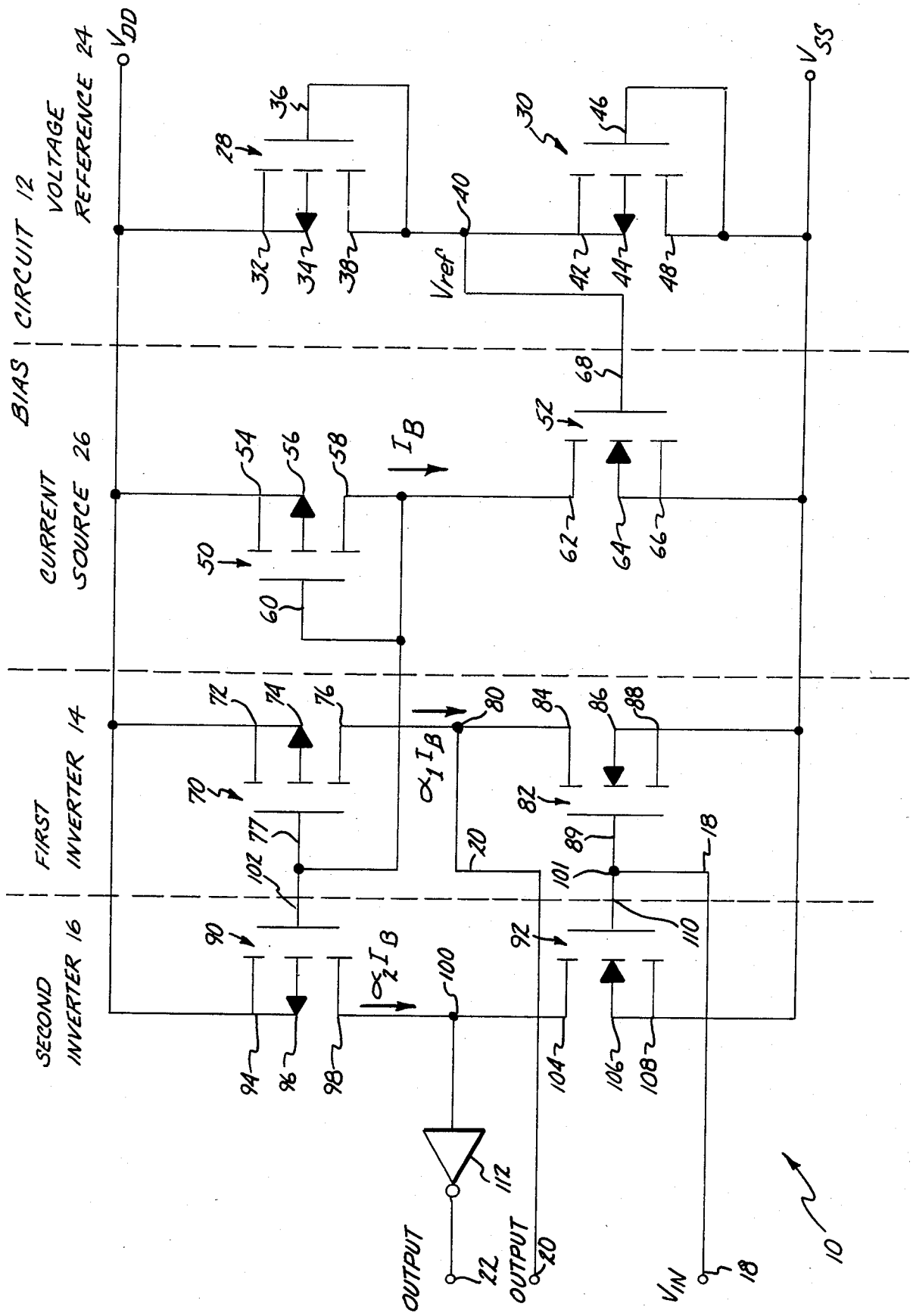

PROCESS INSENSITIVE CMOS WINDOW DETECTOR

REFERENCE TO COPENDING APPLICATION

Reference is hereby made to a copending patent application by W. Linder entitled "CMOS WINDOW DETECTOR WITH HYSTERESIS", now U.S. Pat. No. 4,503,340 which is filed on even date herewith and is assigned to the same assignee.

BACKGROUND OF THE INVENTION

1. Field of the Invention.

The present invention relates to a voltage window detector and in particular to an integrated circuit CMOS window detector.

2. Description of the Prior Art.

A voltage window detector is a commonly used circuit element which provides outputs indicating whether an input voltage is within a "window" defined by a high and a low voltage level. The prior art includes several window detector circuits suitable for use in an integrated circuit. Nutz U.S. Pat. No. 4,184,087, Tanaka U.S. Pat. No. 4,292,552 and Dunphy et al U.S. Pat. No. 4,300,063 all describe window detectors using bipolar transistors. These circuits are implemented using many elements, and are not described as being insensitive to semiconductor process variations. All of these designs establish the threshold level of the window by means of a resistive voltage divider network.

The Dingwall U.S. Pat. No. 4,262,221 is an FET voltage comparator circuit designed for integration on a silicon-on-sapphire monolithic die. A technique for minimizing the transient offsets associated with this type of technology is described. The Musa et al U.S. Pat. No. 4,224,539 describes a FET voltage level detector which is insensitive to variations in power supply voltage.

There is a continuing need for improved integrated circuit voltage window detectors which utilize fewer components than the prior art, thus reducing area used on the integrated circuit chip and improving reliability. In addition, an integrated circuit window detector with reduced power consumption, insensitivity to semiconductor process variations, reduced temperature sensitivity, higher speed, and capability of operating with low supply voltages is needed.

SUMMARY OF THE INVENTION

The present invention is a FET voltage window detector which includes first and second supply means between which a supply voltage is provided and input means for receiving the input voltage. Bias circuit means are used to establish bias current flow between the first and second supply means. The first current mirror FET means establishes a first current flow through its source-drain current path as a function of the bias current flow. The first current control FET means is connected in a first series current path with the first current mirror FET means. The first current control FET means is connected to the input means and controls the first current flow in the first series current path. The first current control FET means changes conductive state when the input voltage reaches the first window voltage level representing one end of the desired voltage window.

In a similar manner, a second current mirror FET means establishes a second current flow as a function of the bias current flow. The second current control FET means is connected in a second series current path with the second current mirror FET means. The second current control FET means is also connected to the input means and controls current flow in the second series current path. The second current control FET means changes conductive state when the input voltage reaches the second window voltage level which represents the other end of the desired voltage window.

Output means are connected to the first and second current paths. The output indicates the relationship of the input voltage to the voltage window, depending upon the states of the first and second current control FETs.

In preferred embodiments of the present invention, the bias circuit means comprises first and second bias current FET means connected in a series current path. The bias current flow is established as a function of a reference voltage and the channel shape factor of the second bias circuit FET means. The first and second current mirror FET means establish the first and second current flow, respectively, as a function of the bias current flow and a ratio of channel shape factors of the respective current mirror FET means and the first bias circuit FET means. The first and second window voltage levels are determined as a function of the first and second current flow and channel shape factor of the first and second current control FET means, respectively.

BRIEF DESCRIPTION OF THE DRAWINGS

The FIGURE is an electrical schematic diagram of the integrated circuit CMOS window detector of the present invention.

DETAILED DESCRIPTION OF THE PREFERRED EMBODIMENTS

A preferred embodiment of window detector 10 of the present invention is illustrated in the FIGURE. This particular embodiment is fabricated using N-tub, silicon gate CMOS technology, although the present invention is applicable to other complementary FET integrated circuit technologies as well.

Window detector 10 includes bias circuit 12 and first and second inverter circuits 14 and 16 connected between a relatively positive voltage supply $V_{DD}$ and a relatively negative voltage supply $V_{SS}$. Input signals are applied to window detector 10 at input terminal 18. Logic level output signals indicating whether the input signal is within or outside the predetermined voltage window are provided at output terminals 20 and 22.

Bias circuit 12 consists of a voltage reference circuit 24 and a current source circuit 26. Voltage reference circuit 24 is formed by two identical enhancement mode P-channel FETs 28 and 30. FET 28 has its source 32 and substrate 34 connected to the relatively positive supply voltage $V_{DD}$. Gate 36 and drain 38 of FET 28 are connected to node 40. FET 30 has its source 42 and substrate 44 connected to node 40. Gate 46 and drain 48 of FET 30 are connected to the relatively negative supply voltage $V_{SS}$. FETs 28 and 30 have identical channel shape factors and operate in the saturation region. They function, therefore, as a voltage divider and produce a reference voltage $V_{ref}$ at node 40. Since the channel shape factor of FETs 28 and 30 are the same, FETs 28 and 30 each conduct the same amount of current. The source-to-drain voltage drop across each of FETs 28 and 30 is identical. Reference voltage $V_{ref}$ provided at node 40 is then found to be:

$$V_{ref} = \frac{(V_{DD} - V_{SS})}{2} \qquad \text{Eq. 1}$$

Current source circuit 26 of bias circuit 12 is formed by enhancement mode P-channel FET 50 and enhancement mode N-channel FET 52. FET 50 has its source 54 and substrate 56 connected to $V_{DD}$. Drain 58 and gate 60 of FET 50 are connected to drain 62 of FET 52. Substrate 64 and source 66 of FET 52 are connected to $V_{SS}$ while its gate 68 is connected at node 40 to receive the reference voltage $V_{ref}$. The current source circuit 26 operates to produce a voltage-to-current conversion. A bias current $I_B$ is produced in the current source FET 52 as a function of the reference voltage $V_{ref}$. The current flow through an N-channel FET operating in its saturation region is described by the following equation:

$$I_D = \frac{\beta S}{2} (V_{GS} - V_T)^2 \qquad \text{Eq. 2}$$

where $\beta$ is the gain of the FET in amperes/volt$^2$, and S is a channel shape factor, $V_{GS}$ is gate-to-source voltage, and $V_T$ is the threshold voltage of the FET.

The gain $\beta$ may be further broken down:

$$\beta = \mu_o C_{OX} \qquad \text{Eq. 3}$$

The mobility $\mu_o$ refers to the ability of electrons (or holes) to flow through the channel of the FET. $C_{OX}$ represents the capacitance of the oxide layer separating the gate and channel of the FET. The $\beta$, or gain, of a FET is a physical constant determined by the process used to fabricate the FET. All FETs of a given channel conductivity type on an integrated circuit will have nearly identical $\beta$ values. $\beta$ values from chip to chip of a given batch of integrated circuits also are typically within close tolerances.

S is the shape factor of an individual FET, and is a ratio of channel width to channel length. Shape factor S is determined by the mask used in fabrication.

$$S = \frac{W}{L} \qquad \text{Eq. 4}$$

It can be seen from Eq. 2 that a FET with a smaller shape factor S requires more gate volta $V_{GS}$ to achieve a given amount of current. Accordingly, a device with a large shape factor requires a lesser amount of gate voltage to produce the same current.

$V_{GS}$ is the voltage potential applied across the gate-to-source terminals of the FET. To make an N-channel enhancement device conductive, $V_{GS}$ must be a positive quantity. This means the gate must be more positive than the source. To make P-channel enhancement devices conductive, a negative $V_{GS}$ voltage is required (i.e. the source must be more positive than the gate).

$V_T$ is the threshold voltage of the FET. No current flows through the FET until $V_{GS}$ exceeds $V_T$. For this reason $V_{GS} - V_T$) is commonly known as the excess voltage, as it is actually the amount of voltage with which the FET is turned on. The threshold voltage $V_T$ of an FET, like $\beta$, is a physical constant determined by the process used to fabricate the device. All FETs of a particular channel conductivity type on a single chip will have nearly identical threshold voltage $V_T$. Tolerances from chip-to-chip using the same process also are very close. Nominal values of $V_T$ are $0.6 \pm 0.3$ volts. The variation ($\pm 0.3$ volts) reflects differences in the process specifications and not the variation across the chip or from chip-to-chip formed using the same process. Threshold voltage variations of less than one percent across a particular integrated circuit chip are typical.

Using Eq. 2, we find the bias current $I_B$ in the current source circuit 26 is:

$$I_B = \frac{\beta_N S_{52}}{2} (V_{GS} - V_{TN})^2 \qquad \text{Eq. 5}$$

$\beta_N$ is the gain of an N-channel FET in the circuit and $S_{52}$ is the shape factor of FET 52. $V_{TN}$ is the threshold voltage of the N-channel FETs of the integrated circuit window detector 10. Assuming $V_{SS} = 0$ volts and $V_{GS} = V_{ref}$:

$$I_B = \frac{\beta_N S_{52}}{2} \left( \frac{V_{DD}}{2} - V_{TN} \right)^2 \qquad \text{Eq. 6}$$

Inverters 14 and 16 are each formed by an enhancement mode P-channel current mirror FET (70, 90) and an enhancement mode N-channel current control FET (82, 92). Current mirror FET 70 of first inverter 14 is a P-channel device having its source 72 and substrate 74 connected to $V_{DD}$. Drain 76 of FET 70 is connected to node 80. Gate 77 of FET 70 is connected to gate 60 of FET 50. Current control FET 82 of first inverter 14 is an N-channel device. Drain 84 of FET 82 is connected to node 80 while both substrate 86 and source 88 are connected to $V_{SS}$. Gate 89 of FET 82 is connected to node 101.

Second inverter 16 is very similar to first inverter 14. Second inverter 16 is formed by current mirror FET 90 and current control FET 92. FET 90 is a P-channel device having its source 94 and substrate 96 connected to $V_{DD}$. Drain 98 of FET 90 is connected to node 100. Gate 102 of FET 90 is connected to gate 60 of FET 50. Current control FET 92 of second inverter 16 is an N-channel device. Drain 104 of FET 92 is connected to node 100 while substrate 106 and source 108 of the device are connected to $V_{SS}$. Gate 110 of FET 92 is connected to node 101.

First inverter 14 and second inverter 16 operate in a similar manner and can be described together. Since current mirror FETs 70 and 90 have respective gates 77 and 102 connected to gate 60 of FET 50 in the current source circuit 26, all three P-channel FETS 50, 70 and 90 have the same source to gate voltage. Current flow $\alpha_1 I_B$ through first inverter 14 and current flow $\alpha_2 I_B$ through second inverter 16, therefore, mirror the bias current $I_B$ established in the current source 26. The constants of proportionality, $\alpha_1$ and $\alpha_2$, are the ratio of the shape factor of the respective current mirror FET (70 or 90) to the shape factor of FET 50.

$$\alpha_1 = \frac{S_{70}}{S_{50}} \quad \alpha_2 = \frac{S_{90}}{S_{50}} \qquad \text{Eq. 7}$$

As they are used in the window detector circuit 10, FETs 82 and 92 of first inverter 14 and second inverter 16, respectively, operate within their saturation region. Current flow through FETs 82 and 92 is, therefore, described by Eq. 2. Since the gain $\beta_N$ of FETs 82 and 92 is large, typically within the range of 30 to 100, and $I_D$ is proportional to the square of the excess voltage, a very narrow range of voltage $V_{GS}$ will cause either FET to pass from a low conductivity state with little or no drain current flow, to a high conductivity state with a large drain current. FETs 82 and 92, therefore, effectively operate as switches and control the flow of the current established by the current mirror FET 70 and 90 through their respective inverter circuits 14 and 16.

FETs 82 and 92 function as current-to-voltage conversion devices. In other words, they convert the currents $\alpha_1 I_B$ and $\alpha_2 I_B$ of inverters 14 and 16, respectively, to a pair of input voltage levels $V_L$ and $V_H$ which define the voltage window. The input signal applied to input terminal 18 is connected to the gates of FETs 82 and 92 through node 101. When the input voltage $V_{IN}$ is sufficient to cause the current control FET 82 or 92 to sink all of the current established by the respective current mirror FET 70 or 90 of that inverter circuit, the current control FET 82 or 92 changes from a low conductivity state to a high conductivity state and allows this current to pass through the series conduction path between $V_{DD}$ and $V_{SS}$.

In one preferred embodiment of window detector 10, the shape factor factors are designed in such a way that FET 82 changes from a low conductivity state to a high conductivity state when the low window voltage level $V_L$ of the voltage window range is reached by the input voltage $V_{IN}$, and FET 92 changes from a low conductivity state to a high conductivity state when the high window voltage level $V_H$ of the window range is reached b $V_{IN}$.

The window voltage level or "trip point" of FET 82 of first inverter 14 establishes the low window level $V_L$ as follows:

$$\alpha_1 I_B = \frac{\beta_N S_{82}}{2}(V_L - V_{TN})^2 \quad \text{Eq. 8a}$$

$$V_L = V_{TN} + \sqrt{\frac{2\alpha_1 I_B}{\beta_N S_{82}}} \quad \text{Eq. 8b}$$

Similarly, the high window voltage level $V_H$ is established by the "trip point" of FET 92 and is:

$$V_H = V_{TN} + \sqrt{\frac{2\alpha_2 I_B}{\beta_N S_{92}}} \quad \text{Eq. 9}$$

Substituting the formula for $I_B$ found in Equation 5 into Equations 8b and 9, we find:

$$V_L = V_{TN}\left(1 - \sqrt{\frac{\alpha_1 S_{52}}{S_{82}}}\right) + \frac{V_{DD}}{2}\sqrt{\frac{\alpha_1 S_{52}}{S_{82}}} \quad \text{Eq. 10a}$$

$$V_H = V_{TN}\left(1 - \sqrt{\frac{\alpha_2 S_{52}}{S_{92}}}\right) + \frac{V_{DD}}{2}\sqrt{\frac{\alpha_2 S_{52}}{S_{92}}} \quad \text{Eq. 10b}$$

The difference in window voltage levels, $\Delta V$, is therefore:

$$\Delta V = \left(\frac{V_{DD}}{2} - V_{TN}\right)\left(\sqrt{\frac{\alpha_2 S_{52}}{S_{92}}} - \sqrt{\frac{\alpha_1 S_{52}}{S_{82}}}\right) \quad \text{Eq. 11b}$$

The inequality $$\frac{S_{90}}{S_{92}} \geq \frac{S_{70}}{S_{82}}$$

must be met for Eq. 11b to hold.

The operation of window detector 10 may be described as follows. An input signal $V_{IN}$ is supplied to the input terminal 18 and then to gates 89 and 110 of FETs 82 and 92, respectively, through node 101. Output 20 is taken from node 80, and output 22 is taken through inverter 112 from node 100.

There are three different possible relationships between input voltage $V_{IN}$ and the voltage window: (1) $V_{IN}$ is below the window, i.e. $V_{IN} < V_L$; (2) $V_{IN}$ is within the window, i.e. $V_L < V_{IN} < V_H$; and (3) $V_{IN}$ is above the window, i.e. $V_{IN} > V_H$. Depending upon which relationship exists, the two bit binary code defined by logic outputs 20 and 22 is different.

When the input voltage $V_{IN}$ applied to input terminal 18 is below the low window voltage level $V_L$, there is no excess voltage and current control FETs 82 and 92 are in a low conductivity state, and effectively appear as an open circuit. Node 80, and therefore output terminal 20 is drawn to the positive supply voltage $V_{DD}$ and thus indicates a "high" or "1" logic level. Node 100 is at a "high" or "1" logic level, and output terminal 22 indicates a "low" or "0" logic level, (due to the inversion by inverter 112).

When the input voltage $V_{IN}$ is above the low window voltage level $V_L$ and yet is still below the high window voltage level $V_H$, the input voltage $V_{IN}$ is within the voltage window that window detector 10 is designed to detect. Since $V_{IN} > V_L$, FET 82 has sufficient excess voltage to conduct current $\alpha_1 I_B$. Current control FET 82 changes to a high conductivity state and appears much like a short circuit. Node 80 and output terminal 20 are drawn to the relatively negative supply voltage $V_{SS}$ and thus indicate a "low" or "0" logic level. Since input voltage $V_{IN}$ is not great enough to cause current control FET 92 to conduct current $\alpha_2 I_B$, node 100 is a "high" or "1" logic level and output terminal 22 is a "low" or "0" logic level. Output terminals 20 and 22 thus indicate logic levels of "0" when the input voltage $V_{IN}$ is within the voltage window that window detector 10 has been designed to detect.

When $V_{IN}$ applied to input terminal 18 is greater than the high window voltage level $V_H$, current control FET 92 has sufficient excess voltage to conduct current $\alpha_2 I_B$, and the device is in a high conductivity state. Node 100 is then at a "low" or "0" logic level. Inverter 112 inverts this state so output terminal 22 indicates a "high" or "1" logic level. FET 82 is in its high conductivity state and provides a "low" or "0" logic level.

It can be seen that only when the input voltage $V_{IN}$ is within the voltage window, will both outputs 20 and 22 be in the "low" or "0" state. In any other case, one of the outputs 20 or 22 is in a "high" or "1" state.

In one preferred embodiment of the invention, design of the window voltage levels proceeds as follows. The channel shape factors of both current control FETs 82 and 92 are made identical. The channel shape factor of FETs 50 and 90 also are made identical. Therefore $\alpha_2 = 1$. Equations 10b and 11b thus become:

$$V_H = V_{TN}\left(1 - \sqrt{\frac{S_{52}}{S_{92}}}\right) + \frac{V_{DD}}{2}\sqrt{\frac{S_{52}}{S_{92}}} \qquad \text{Eq. 12}$$

$$\Delta V\left(\frac{V_{DD}}{2} - V_{TN}\right)\sqrt{\frac{S_{52}}{S_{92}}}\left(1 - \sqrt{\alpha_1}\right) \qquad \text{Eq. 13}$$

Equation 12 is then solved for a ratio of the shape factor factors of FET 52 to FET 92 using the nominal value for $V_{TN}$. Using the desired window voltage range $\Delta V$, the low window voltage level is then:

$$V_L = V_H = \Delta V \qquad \text{Eq. 14}$$

Equation 13 is then solved for $\alpha_1$. The shape factors needed to achieve the desired window characteristics are now known and available to the circuit designer.

An example using a 5-volt supply (i.e. $V_{DD} = 5$ V, $V_{SS} = 0$), $V_{TN} = 0.6$ V $\pm 0.3$ V, $V_H = 3$ V, with a voltage window range $\Delta V = 1$ V yields the following parameters:

$$\frac{S_{52}}{S_{92}} = \frac{S_{52}}{S_{82}} = 1.52 \qquad \text{Eq. 15}$$

$$\alpha_1 = .33 = \frac{S_{70}}{S_{90}} = \frac{S_{70}}{S_{50}} \qquad \text{Eq. 16}$$

From Equations 11b, 8b and 9 it is seen that the window range $\Delta V$ and the window voltage levels $V_L$ and $V_H$ are independent of all process variations except the variation in the N-channel threshold voltage $V_{TN}$. The sensitivity of these parameters to small variations in $V_{TN}$ is found from the following partial differential equations:

$$\frac{\partial \Delta V}{\partial V_{TN}} = -(1 - \sqrt{\alpha_1})\sqrt{\frac{S_{52}}{S_{92}}} \qquad \text{Eq. 17}$$

$$\frac{\partial V_H}{\partial V_{TN}} = 1 - \sqrt{\frac{S_{52}}{S_{92}}} \qquad \text{Eq. 18}$$

Using the values found for this design example, these equations then become:

$$\frac{\partial \Delta V}{\partial V_{TN}} = -.52 \qquad \text{Eq. 19}$$

$$\frac{\partial V_H}{\partial V_{TN}} = -.23 \qquad \text{Eq. 20}$$

The expected variations in $\Delta V$ and $V_H$ are then:

$$\Delta V = 1 \text{ V} \pm 150 \text{ mV} \qquad \text{Eq. 21}$$

$$V_H = 3 \text{ V} \pm 70 \text{ mV} \qquad \text{Eq. 22}$$

It is seen from equations 8b and 9 that the window voltage levels are indepedent of $\beta$, and therefore are independent of any resulting variations in $\beta$ with temperature. While the window voltage levels are dependent on threshold voltage $V_{TN}$, it has been shown by equations 18 and 20 that this dependency is low. Since variations in $V_{TN}$ with temperature are small, variations in the window voltage levels due to changes in $V_{TN}$ with temperature are minimal.

In conclusion, the CMOS voltage window detector 10 of the present invention provides a means for determining whether an input signal is within a predetermined voltage window. The detector 10 uses very few components and is capable of being fully integrated. Performance is largely independent of process variations. The window voltage levels are determined by physical constants (shape factors of the FETs) used in fabrication.

The window detector of the present invention has other important advantages as well. First, the speed of the voltage window detector of the present invention is higher than the prior art implementations which use complete integrated circuit comparators. Second, the present invention uses fewer components, thus requiring less area on an integrated circuit chip. Third, the window detector of the present invention is capable of operation with very low supply voltages (e.g. as low as 2.5 volts).

Although the present invention has been described with reference to preferred embodiments, workers skilled in the art will recognize that changes may be made in form and detail without departing from the spirit and scope of the invention. In particular, it should be noted that although the specific preferred embodiment described uses N-tub silicon gate CMOS technology, the present invention can be fabricated in complementary form (i.e. P-tub CMOS technology), using metal gate CMOS technology, or using other FET integrated circuit technologies such as JFET technology. Similarly, although in the embodiment shown the current mirror FETs are P-channel devices and the current control FETs are N-channel devices, other embodiments utilize N-channel current mirror FETs and P-channel current control FETs.

What is claimed is:

1. A field effect transistor (FET) integrated circuit voltage window detector for comparing an input voltage with first and second voltage levels representing a desired voltage window, the circuit comprising:
   input means for receiving the input voltage;
   first and second supply means adapted to receive first and second supply voltage levels, respectively;
   bias circuit means for establishing bias current flow between the first and second supply means;
   first current mirror FET means having a channel, a gate, a source, and a drain, the first current mirror FET means being connected to the bias circuit means so that a first current flow through the source-drain current path of the first current mirror FET means is established as a function of the bias current flow;
   first current control FET means having a channel, a gate, a drain, and a source, the source and drain of the first current control FET means being connected in a first series current path with the source and drain of the first current mirror FET means between the first and second supply means, and the gate of the first current control FET means being connected to the input means to receive the input voltage, so that when the input voltage attains the first voltage level current flow through the source-drain current path of the first current control FET means changes;
   second current mirror FET means having a channel, a gate, a source, and a drain, the second current mirror FET means being connected to the bias circuit means so that a second current flow through the source-drain current path of the second current mirror FET means is established as a function of the bias current flow;

second current control FET means having a channel, a gate, a drain, and a source, the drain and source of the second current control FET means being connected in a second series current path with the source and drain of the second current mirror FET means between the first and second supply means, and the gate of the second current control FET means being connected to the input means to receive the input voltage, so that when the input voltage attains the second voltage level current flow through the source-drain current path of the second current control FET means changes; and output means connected to the first and second current paths to provide an output which indicates the relationship of the input voltage to the voltage window defined by the first and second voltage levels.

2. The circuit of claim 1 wherein the bias circuit means comprises:

means for providing a reference voltage; and current source means for establishing the bias current flow as a function of the reference voltage.

3. The circuit of claim 2 wherein the current source means comprises:

first bias current FET means having a drain, a source, a gate and a channel, the drain and source connected in a bias current path between the first and second supply means and the gate connected to the drain, and;

second bias current FET means having a drain, a source, a gate and a channel, the drain and source connected in the bias current path and the gate connected to receive the reference voltage.

4. The circuit of claim 3 wherein:

the first bias current FET means is an enhancement mode FET means having a first conductivity type channel, the source connected to the first supply means; and the second bias current FET means is an enhancement mode FET means having a second conductivity type channel, the source connected to the second supply means, and the second FET means establishing the bias current flow as a function of the reference voltage and shape factor of the channel of the second bias current FET means.

5. The circuit of claim 4 wherein:

the first current mirror FET means is an enhancement mode FET means having a first conductivity type channel, the source connected to the first supply means, the gate connected to the gate of the first bias current FET means, and the drain connected in the first series current path so that the first current flow is determined as a function of the bias current flow and a ratio of shape factors of the channels of the first bias current FET means and the first current mirror FET means; and the first current control FET means is an enhancement mode FET means having a second conductivity type channel, the source connected to the second supply means, the drain connected in the first series current path, and wherein the first voltage level is determined by the first current flow and shape factor of the channel of the first current control FET means.

6. The circuit of claims 4 or 5 wherein:

the second current mirror FET means is an enhancement mode FET means having a first conductivity type channel, the source connected to the first supply means, the gate connected to the gate of the first bias current FET means, and the drain connected in the second series current path so that the second current flow is determined as a function of the bias current flow and a ratio of shape factors of the channels of the first bias current FET means and the second current mirror FET means; and the second current control FET means is an enhancement mode FET means having a second conductivity type channel, the source connected to the second supply means, the drain connected in the second series current path, and wherein the second voltage level is determined as a function of the second current flow and shape factor of the channel of the second current control FET means.

7. The circuit of claim 2 wherein the means for providing a reference voltage comprises a voltage divider means connected between the first and second supply means.

8. The circuit of claim 7 wherein the voltage divider means comprises a plurality of FETs each having a gate, a drain and a source, the gate and drain connected together and the source and the drain connected in a series current path between the first and second supply means.

9. An integrated circuit for comparing an input voltage signal with a voltage window defined by first and second window voltage levels, the circuit comprising:

input means for receiving an input voltage signal;

first and second supply means adapted to receive first and second supply voltage levels, respectively;

bias circuit means connected between first and second supply means, for establishing bias current flow;

first inverter means for comparing the input voltage signal to the first window voltage level, the first inverter means connected in a first inverter current path between the first and second supply means and comprising:

first current mirror means for establishing a first inverter current in the first inverter current path, the first inverter current determined as a function of the bias current flow;

first current control means for controlling flow of the first inverter current through the first inverter current path as a function of the input voltage signal, wherein the first current control means changes between a low conductivity and a high conductivity state when the first window voltage level is attained by the input voltage signal; and first output means for providing a first output signal indicative of the relationship of the input voltage signal to the first window voltage level based upon the state of the first current control means;

second inverter means for comparing the input voltage signal to the second window voltage level, the second inverter means connected in a second inverter current path between the first and second supply means and comprising:

second current mirror means for establishing a second inverter current in the second inverter current path, the second inverter current determined as a function of the bias current flow;

second current control means for controlling flow of the second inverter current through the second inverter current path as a function of the input voltage signal, wherein the second current control means changes between a low conductivity and a high conductivity state when the second window voltage level is attained by the input voltage signal; and second output means for providing a second output signal indicative of the relationship of the input voltage signal to the first window voltage level based upon the state of the second control means.

10. The circuit of claim 9 wherein:

the first current mirror means has a drain, a source, a gate and a channel, the drain and source connected in the first inverter current path and the gate connected to the bias circuit means so that the first inverter current is determied as a function of the bias current flow;

the first current control means has a drain, a source, a gate and a channel, the channel having a conductivity type opposite the channel of the first current mirror means, the drain and source connected in the first inverter current path, and the gate connected to the input means to receive the input voltage signal so that the first current control means changes between a low conductivity and a high conductivity state when the input voltage signal attains the first window voltage level, and wherein the first window voltage level is determined as a function of the first inverter current and channel shape factor of the first current control means;

the second current mirror means has a drain, a source, a gate and a channel, the drain and source connected in the second inverter current path and the gate connected to the bias circuit means so that the second inverter current is determined as a function of the bias current flow; and the second current control means has a drain, a source, a gate and a channel, the channel having a conductivity type opposite the channel of the second current mirror means, the drain and source connected in the second inverter current path, and the gate connected to the input means to receive the input voltage signal so that the second current control means changes between a low conductivity and a high conductivity state when the input voltage signal attains the second window voltage level, and wherein the second window voltage level is determined as a function of the second inverter current and channel shape factor of the second current control FET means.

11. The circuit of claim 9 wherein the bias circuit means comprises:

means for providing a reference voltage; and current source means for establishing the bias current flow as a function of the reference voltage.

12. The circuit of claim 11 wherein the current source means comprises:

first bias current FET means having a drain, a source, a gate and a channel, the drain and source connected in a bias current path between the first and second supply means and the gate connected to the drain, and;

second bias current FET means having a drain, a source, a gate and a channel, the drain and source connected in the bias current path and the gate connected to receive the reference voltage.

13. The circuit of claim 12 wherein:

the first bias current FET means is an enhancement mode FET means having a first conductivity type channel, the source connected to the first supply means, the drain connected in the bias current path, and the gate connected to the drain; and the second bias current FET means is an enhancement mode FET means having a second conductivity type channel, the drain connected in the bias current path, the source connected to the second supply means, and the gate connected to receive the reference voltage, the second FET means establishing the bias current flow as a function of the reference voltage and channel shape factor of the second bias current FET means.

14. The circuit of claim 13 wherein:

the first current mirror means is an enhancement mode FET means having a first conductivity type channel, the source connected to the first supply means, the gate connected to the gate of the first bias current FET means, and the drain connected in the first inverter current path so that the first inverter current is determined as a function of the bias current flow and a ratio of shape factors of the channels of the first bias current FET means and the first current mirror FET means; and the first current control means is an enhancement mode FET means having a second conductivity type channel, and its source is connected to the second supply means.

15. The circuit of claims 13 or 14 wherein:

the second current mirror means is an enhancement mode FET means having a first conductivity type channel, the source connected to the first supply means, the gate connected to the gate of the first bias current FET means, and the drain connected in the second inverter current path so that the second inverter current is determined as a function of the bias current flow and a ratio of shape factors of the channels of the first bias current FET means and the second current mirror FET means; and the second current control means is an enhancement mode FET means having a second conductivity type channel, and its source is connected to the second supply means.

16. The circuit of claim 11 wherein the means for providing a reference voltage comprises a voltage divider means connected between the first and second supply means.

17. The circuit of claim 16 wherein the voltage divider means comprises a plurality of FETs each having a gate, a drain and a source, the gate and drain connected together and the source and the drain connected in a series current path between the first and second supply means.

* * * * *